United States Patent
Benson et al.

(10) Patent No.: US 6,861,208 B2
(45) Date of Patent: Mar. 1, 2005

(54) FULLERENE ADDITION IN PHOTORESIST VIA INCORPORATION IN THE DEVELOPER

(75) Inventors: J. David Benson, Burke, VA (US); John H. Dinan, Alexandria, VA (US); Michael Martinka, Springfield, VA (US); Leo Anthony Almeida, Alexandria, VA (US); Phillip R. Boyd, St. Leonard, MD (US); Andrew J. Stoltz, Jr., Stafford, VA (US); Andrew W. Kaleczyc, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 182 days.

(21) Appl. No.: 10/389,760

(22) Filed: Mar. 18, 2003

(65) Prior Publication Data

US 2004/0185387 A1 Sep. 23, 2004

(51) Int. Cl.⁷ .................................................. G03F 7/26

(52) U.S. Cl. ........................ 430/322; 430/323; 430/325; 430/331

(58) Field of Search ................................. 430/311, 313, 430/322, 323, 325, 331

(56) References Cited

U.S. PATENT DOCUMENTS 6,395,447 B1 * 5/2002 Ishii et al. .................. 430/191
2002/0195600 A1 * 12/2002 Leuschner .................... 257/40

* cited by examiner

Primary Examiner—Kathleen Duda
(74) Attorney, Agent, or Firm—Arthur K. Samora; William H. Anderson

(57) ABSTRACT

A lithographic imaging method of the present invention includes the initial step of providing a substrate made from Mercury, Cadmium and Telluride materials (HgCdTe). The HgCdTe substrate is coated with a diazonaphthoquinone (DNQ) Novolak photoresist material to establish an imaging medium. The imaging medium is exposed to an image pattern and then developed in a tetra-methyl ammonium hydroxide (TMAH) solution. The TMAH solution includes a fullerene ($C_{60}$) material dissolved therein to retard the subsequent etching of the imaging medium. The incorporation of fullerene into the photoresist material indirectly via the developing solution avoids the solubility and ultraviolet (UV) absorbance disadvantages inherent in adding fullerenes directly to the photoresist prior to placement on the substrate. After development, the imaging medium is etched to transfer the recorded image pattern to the substrate. The fullerene cooperates with the photoresist material to slow the etching process, which allows for a highly reticulated HgCdTe detectors and IR images having greatly enhanced resolution.

10 Claims, 2 Drawing Sheets

FULLERENE ADDITION IN PHOTORESIST VIA INCORPORATION IN THE DEVELOPER

FIELD OF THE INVENTION

The present invention applies generally to microlithography methods. More particularly, the present invention applies to microlithography methods used in processing infrared (IR) imaging arrays. The present invention is particularly, but not exclusively, useful as in a reticulation method that incorporates a fullerene material into a photoresist material via a developing solution, in order to obtain an IR imaging array with increased resolution.

BACKGROUND OF THE INVENTION

Lithographic imaging systems are well known in the prior art for recording images. To do this, a resist coated substrate is provided and then exposed. After exposure, the resist is developed, and then the substrate is etched via a chemical and/or physical process to yield the reticulated substrate. For infrared (IR) systems, the substrate that is used is often made from a combination of Mercury, Cadmium and Telluride materials (HgCdTe). After exposure, the resist is developed and an Electron Cyclotron Resonance (ECR) method in an argon/hydrogen gas environment is used to etch the HgCdTe substrate.

For IR imaging systems, the clarity of the imaged object is, at least in part, dependent on the reticulation properties of the recording substrate, or the ability of the substrate to be sub-divided into a grid of substrate pixels during the etching process. Substrates having more pixels per unit area yield images with greater resolution than substrates with fewer pixels per unit area. It is also very desirable that the trenches are as deep and have as high a aspect ratio (ratio of depth to width) as is feasible, in order to more clearly define the pixels.

The ECR etching process mentioned above etches the trenches in the substrate to define the pixels. Accordingly, to generate IR images having increased resolution, it is desirable to slow down the ECR etching of the pixel regions to thereby enhance the reticulation of the HgCdTe substrate. This is accomplished by overlaying the pixel regions of the substrate with a thin photoresist material. Effective photoresist materials slow the etching rate of the pixel regions, which allows for greater reticulation of the HgCdTe substrate, which further allows for more pixels defined by deeper trenches and IR images of increased resolution.

Cyclical Carbon compounds such as fullerene can be added to the photoresist material to further slow the etching process and thereby enhance reticulation of the substrate. However, the addition of fullerene to the photoresist creates other difficulties in the imaging process. Specifically, fullerene is not soluble in the casting solvent of most commercially available most photoresist materials. Also, adding fullerene to most commercially available photoresist materials negatively affects the photoresist ability to accurately record an image. This, obviously, is an unwanted side effect. What is desired is a microlithography method that incorporates fullerenes into the photoresist materials to slow the photoresist etching process in a manner, but which also avoids the disadvantages of using fullerenes known in the prior art.

In light of the above, it is an object of the present invention to provide a microlithography imaging method that improves the reticulation properties of the imaging substrate. It is another object of the present invention to provide a microlithography imaging method that yields images with increased resolution. Another object of the present invention is to provide a microlithography imaging method that incorporates a fullerene material into a photoresist material to thereby enhance the ECR etching process for an HgCdTe substrate. Yet another object of the present invention is to provide a microlithography method that incorporates a fullerene material into the photoresist material via a developing solvent to slow the photoresist etching and thereby yield IR images of greater resolution. It is another object of the present invention to provide a microlithography method that is relatively easy to accomplish in a cost-effective manner.

SUMMARY OF THE INVENTION

A microlithography method in accordance with the present invention includes the initial step of providing a substrate. Preferably, the substrate is made from Mercury, Cadmium and Telluride materials (HgCdTe). The method also includes the step of overlaying the HgCdTe substrate with a photoresist material. Preferably, the photoresist material is a diazonaphthoquinone (DNQ) Novolak material. The photoresist material establishes an imaging medium for recording an image pattern.

The method of the present invention further includes the steps of exposing the imaging medium to the pattern image to be recorded, and then developing the exposed imaging medium. For development, the imaging medium is submerged in a developing solution. Preferably, the developing solution is a 0.26N tetra-methyl ammonium hydroxide (TMAH) solution.

Importantly, the method includes the step of incorporating a cyclical Carbon based material, preferably fullerene, into developing solution. The incorporation of fullerene is accomplished by use of a stir plate and/or sonication to ensure dissolution of the fullerene in the TMAH solution. The incorporation of the fullerene into the photoresist material indirectly via the developing solution as the image is developed obviates the solubility and ultraviolet (UV) absorbance disadvantages inherent in adding fullerenes directly to the DNQ Novolak photoresist material prior to placing the photoresist material on the substrate.

The methods of the present invention also include etching the developed image to transfer the pattern into the substrate. This is accomplished via electron cyclotron resonance (ECR) in an Argon/Hydrogen gas environment, in order to reticulate (etch) the substrate into a grid of highly defined pixels. The photoresist material cited protects the HgCdTe from being etched, which allows for more clearly defined pixels. The fullerene in the incorporation step cited above cooperates with the photoresist material to slow the photoresist etching process even further. The overall result is a highly reticulated substrate with pixels that are surrounded by relatively deep trenches, which further results in the ability to record an IR image of greatly enhanced resolution.

BRIEF DESCRIPTION OF THE DRAWINGS

The novel features of this invention will be best understood from the accompanying drawings, taken in conjunction with the accompanying description, in which similar characters refer to similar parts, and in which.

WRITTEN DESCRIPTION OF THE PREFERRED EMBODIMENT

Figure 1:
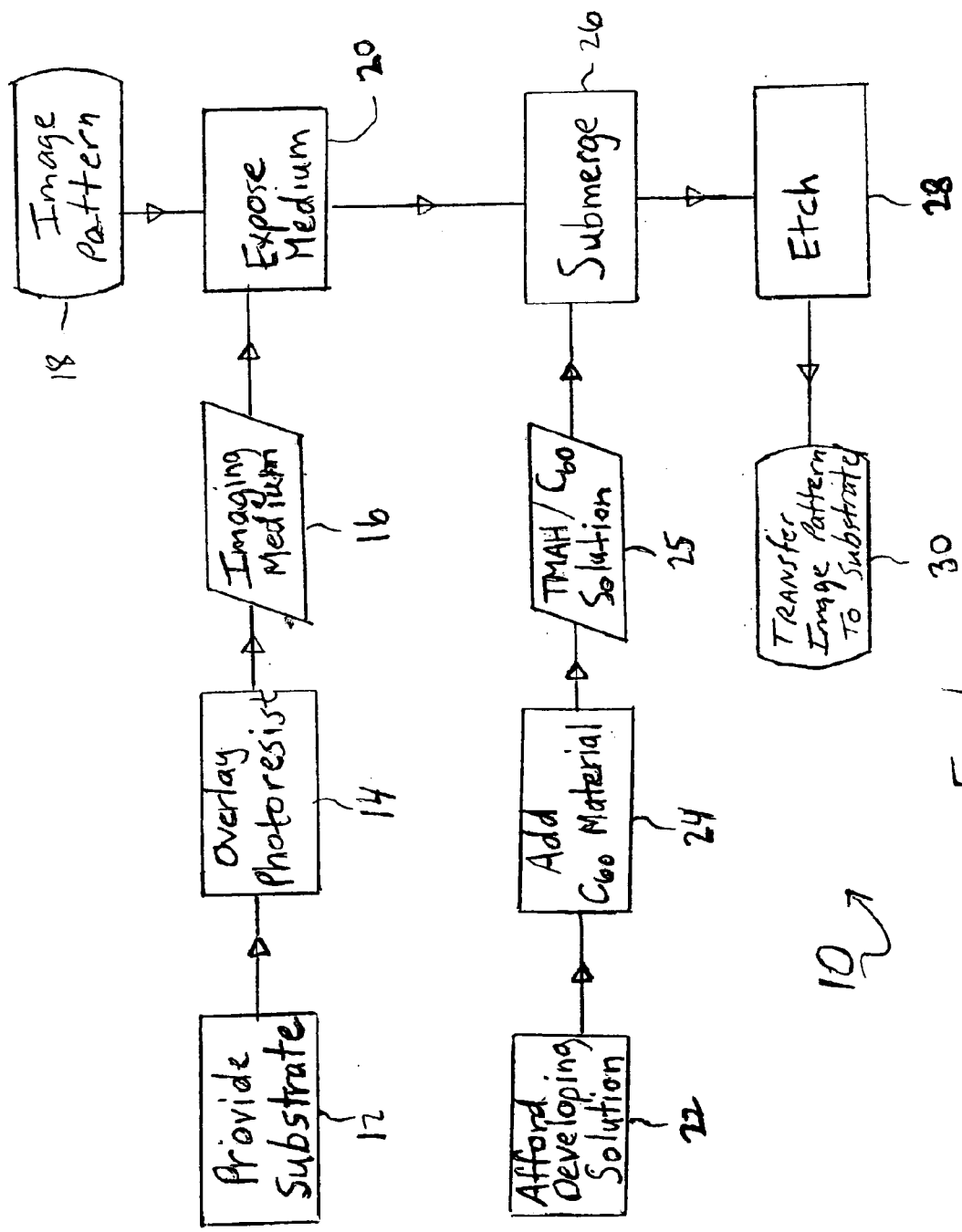
FIG. 1 is a block diagram that graphically illustrates the steps of the methods of the present invention.

Referring to FIG. 1, the method of the present invention is depicted by the block diagram generally designated by character reference 10. As indicated in FIG. 1, the method includes the initial step of providing a substrate for recording the image pattern (illustrated by block 12). Preferably, the substrate is made from Mercury, Cadmium and Telluride materials (HgCdTe), although it is to be appreciated that other materials could be used for the substrate without departing from the scope of the present invention.

The method of the present invention also includes the step of overlaying the HgCdTe substrate with a photoresist material to enhance the reticulation of the substrate, as indicated by block 14. Preferably, the photoresist material is a diazonapthoquinone (DNQ) Novolak material. The substrate and photoresist cooperate to establish an imaging medium 16 for recording image patterns. To record the images, the imaging medium is exposed to an ultraviolet (UV) image pattern 18. The exposure step, indicated by block 20 in FIG. 1, imprints the image pattern on the substrate for further processing as described below.

A developing solution is afforded to develop the image pattern on the substrate, as depicted by block 22. Preferably, the developing solution is a 0.26 Normal (0.26N) tetra-methyl ammonium hydroxide (TMAH) solution.

Importantly, before the substrate is placed in the solution to develop the image pattern, the imaging method of the present invention includes the step of incorporating a material having a cyclical Carbon atomic structure, preferably fullerene ($C_{60}$) into the developing solution, as indicated by block 24. The incorporation of fullerene is enhanced by a combination of stirring (via a stir plate) and/or sonication to ensure dissolution of the fullerene in the developing solution. The incorporation of the fullerene into the photoresist material indirectly via the developing solution during the submerging step, instead of directly into the photoresist material prior to placement of the photoresist material on the substrate, obviates the solubility and ultraviolet (UV) absorbance disadvantages inherent in adding fullerenes to DNQ Novolak and similar photoresist materials. The incorporation step yields a $C_{60}$/TMAH developing solution illustrated by block 25 in FIG. 1.

After the cyclical carbon material is incorporated into the developing solution and exposure, the imaging medium is submerged in a developing solution to process the image pattern, as shown by block 26 in FIG. 1.

After the submerging step, the method of the present invention includes an etching step, as indicated by block 28 in FIG. 1. Preferably, the etching step is accomplished via Electron Cyclotron Resonance (ECR) in an Argon/Hydrogen gas environment. The etching step reticulates the substrate into a grid of pixels as shown in block 30. The photoresist material and the substrate etch at much different rates, which allows for pixels to be etched with greater definition during transfer of the pattern to the substrate.

Figure 2A:
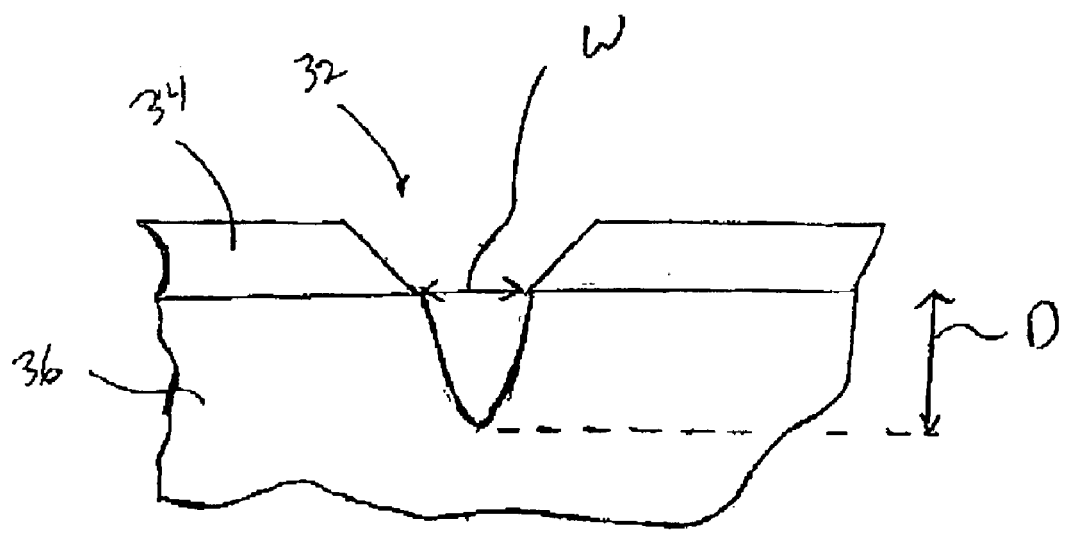
FIG. 2A is a greatly enlarged (microscopic scale) cross-sectional view of a prior art substrate and photoresist material, which shows the manner in which trenches are formed in the substrate/photoresist during the etching step.

FIGS. 2A (Prior Art) and 2B are cross-sectional views which illustrates a trench 32 having a width W and a depth D. For both FIG. 2A (Prior Art) and 2B, photoresist material 34 is shown overlaid over substrate 36. Since the photoresist material etches more slowly than the underlying substrate, trenches 32 become etched in the substrate during the etching step. These trenches have an aspect ration defined as the ratio of the depth D to the width W of the trench.

Figure 2B:
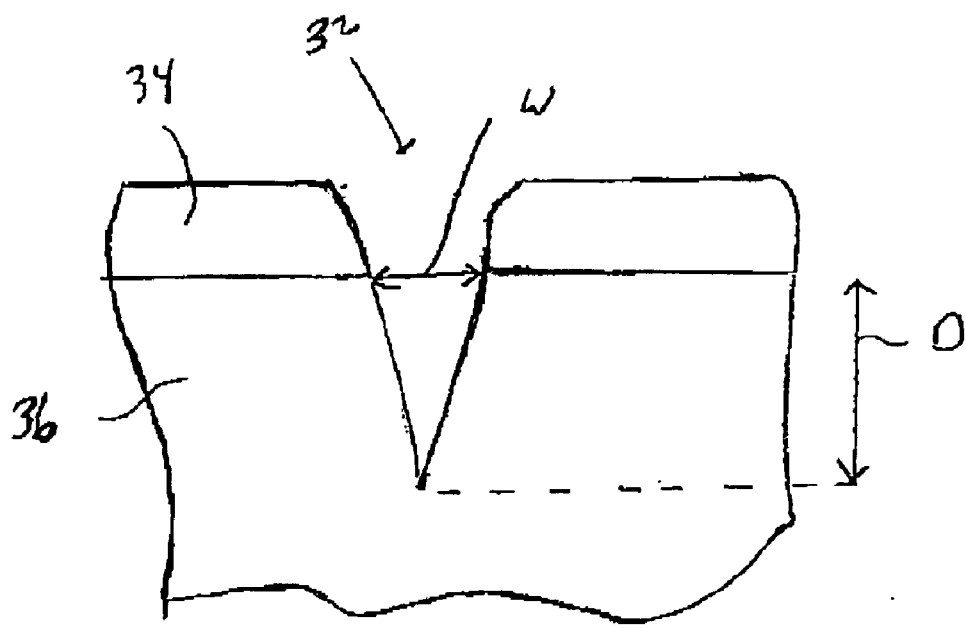
FIG. 2B is the same as FIG. 2A, but which illustrates the aspect ratio of trenches that are formed in the substrate/photoresist by the methods of the present invention.

For FIG. 2B, which illustrates the trenches etched by the method of the present invention, the fullerene has cooperated with the DNQ Novolak photoresist material to slow the etch rate even further relative to the underlying substrate. The result is a trench 32 with a deeper depth D, a narrower width W and a much higher aspect ratio that a prior art trench that was etched in the same substrate using the same ECR etch process in the same Argon/Hydrogen environment. At a micro level, the deeper trenches with higher aspect ratios result in more clearly defined pixels, which further allows for recording IR images of increased clarity. Thus, the incorporation of fullerene into the photoresist material as recited above results in recorded IR images having greatly increased resolution.

While the microlithography methods of the present invention, as herein shown and disclosed in detail, are fully capable of obtaining the objects and providing the advantages above stated, it is to be understood that the presently preferred embodiments are merely illustrative of the invention. As such, no limitations are intended other than as defined in the appended claims.

What is claimed is:

1. A microlithography method comprising the steps of:
    A) providing an substrate;
    B) overlaying the substrate with a photoresist material to establish an image medium;
    C) exposing the image medium to an image pattern;
    D) adding a fullerene ($C_{60}$) material into a developing solution; and,
    E) submerging said imaging medium in said solution to yield said image pattern.

2. The method of claim 1 wherein said fullerene is incorporated into said photoresist material during step E).

3. The method of claim 1 wherein said step A) is accomplished with a material that includes Mercury, Cadmium and Telluride materials (HgCdTe).

4. The method of claim 1 wherein said step B) is accomplished with a diazonophthoquinone (DNQ) Novolak photoresist material.

5. The method of claim 1 wherein said developing solution in step D) is a tetra-methyl ammonium hydroxide (TMAH) solution.

6. The method of claim 5 wherein said step D) is accomplished by sonicating said fullerene in said TMAH solution.

7. The method of claim 1 further comprising the step of:
    F) etching said imaging medium.

8. The method of claim 7 wherein said step F) is accomplished by electron cyclotron resonance (ECR) in an Argon/Hydrogen environment.

9. A technique for lithographic imaging comprising the steps of:
    A) providing a substrate;
    B) coating said substrate with a photoresist material to establish an imaging medium;
    C) exposing said imaging medium to an image pattern; and,
    D) incorporating a fullerene material into said photoresist material, said incorporating step being accomplished after said coating step is complete.

10. The method of claim 9 wherein said fullerene is insoluble in said photoresist material and wherein said step D) further comprises the steps of:
    E) affording a developing solution;
    F) dissolving said fullerene in said developing solution; and,
    G) submerging said imaging medium in said developing solution.

* * * * *